United States Patent [19]

Fletcher et al.

[11] 4,025,866
[45] May 24, 1977

[54] OPEN LOOP DIGITAL FREQUENCY MULTIPLIER

[76] Inventors: James C. Fletcher, Administrator of the National Aeronautics and Space Administration, with respect to an invention of; Robert Clark Moore, Laurel, Md.

[22] Filed: Nov. 10, 1975

[21] Appl. No.: 630,583

[52] U.S. Cl. ............................. 328/38; 307/225 R; 328/39; 328/48; 328/63
[51] Int. Cl.$^2$ .................... H03K 5/00; H03K 21/32
[58] Field of Search .................. 307/220 R, 225 R; 328/38, 129, 39, 48, 63

[56] References Cited

UNITED STATES PATENTS

| | | | |
|---|---|---|---|
| 3,579,126 | 5/1971 | Paul | 328/129 |
| 3,657,658 | 4/1972 | Kubo | 328/38 |
| 3,673,391 | 6/1972 | Lougheed | 328/38 |
| 3,716,794 | 2/1973 | Teggatz et al. | 328/39 |
| 3,835,396 | 9/1974 | Demos et al. | 328/38 |

OTHER PUBLICATIONS

"A New Type of Digital Frequency Multiplier," by Horelick et al., Proceedings of the IEEE, Sept. 1975, [pp. 1365–1366].

*Primary Examiner*—Stanley D. Miller, Jr.
*Attorney, Agent, or Firm*—Marvin J. Marnock; John R. Manning; Marvin F. Matthews

[57] ABSTRACT

An open loop digital frequency multiplier with a multiplied output synchonized to low frequency clock pulses. The system includes a multi-stage digital counter which provides a pulse output as a function of an integer divisor. The integer divisor and the timing or counting cycle of the counter are interrelated to the frequency of a clock input. The counting cycle is controlled by a one-shot multivibrator which, in turn, is driven by a reference frequency input.

6 Claims, 2 Drawing Figures

OPEN LOOP DIGITAL FREQUENCY MULTIPLIER

ORIGIN OF THE INVENTION

The invention described herein was made in the performance of work under a NASA contract and is subject to the provisions of Section 305 of the National Aeronautics and Space Act of 1958, Public Law 85–568 (72 Stat. 435; 45 U.S.C. 2457).

FIELD OF THE INVENTION

This invention relates to a system for producing multiplied frequency pulses which are synchronized to a low frequency reference clock pulse, and, more particularly, for producing high frequency clock pulses as a multiple function of low frequency clock pulses in a stabilized operation.

Digital frequency multiplying systems are frequently made fairly complex in order to obtain a reliable control of two frequencies in synchronization. As compared to conventional phase-locked loop systems, the present invention utilizes digital circuits. It also avoids use of bulk components and has zero acquisition time. Thus, it is the purpose of this invention to provide a relatively simple straight-forward system by which a digital frequency multiplier can be synchronized to low frequency clock pulses.

SUMMARY OF THE INVENTION

In the present invention, a digital frequency multiplier system synchronizes and multiplies low frequency clock pulses to high frequency clock pulses where the high frequency clock pulses are a multiple of the low frequency. The reset of a digital counter means is controlled by a timing period so that output frequency of the pulses from the counter means is an even multiple of the timing period. The timing period is controlled by a one-shot multivibrator which is triggered by reference frequency pulses. To obtain reliability, the digital counter means has a divider circuit which divides input high frequency clock pulses by an integer value so that its output pulses are a function of the integer value. By relating the values of the integer value and the timing period as a function of the frequency of the high frequency clock pulses, the low frequency clock pulses are synchronized to the output frequency of the digital counter means with a high degree of reliability.

DESCRIPTION OF PREFERRED EMBODIMENT

Figure 1:
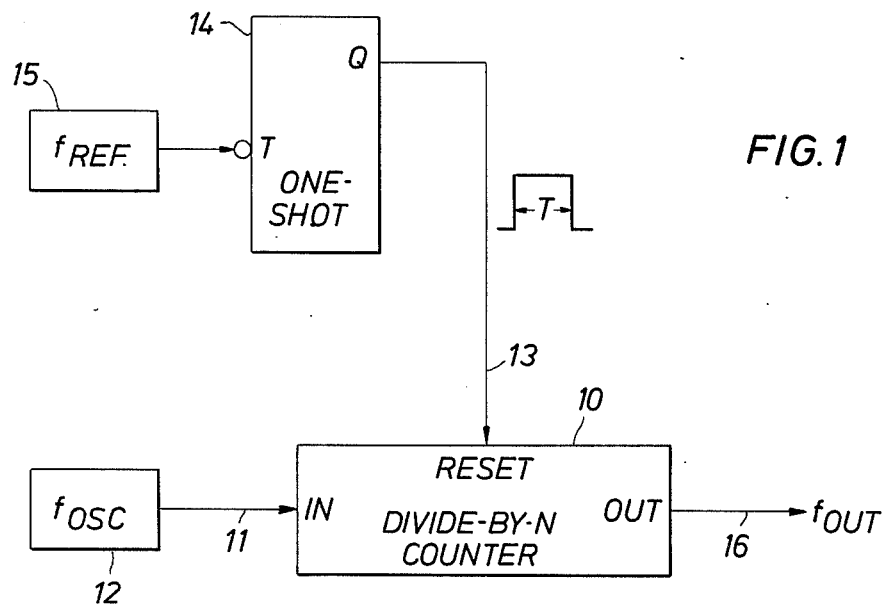
FIG. 1 is a schematic representation of one embodiment of the present invention.

Referring now to FIG. 1, a digital counter means 10 has an input 11 for receiving clock pulses from a high frequency generator or oscillator 12. Built into the counter 10 is divider circuit means which divide the input frequency by a integer value "N". Thus, the output pulses are a function of the integer value $N$ and the input frequency. The counter 10 has a reset input 13 by which a pulse input can reset the counter circuits. The reset input 13 is coupled to one-shot multivibrator 14, which, in turn, is connected to a frequency reference source 15. The frequency reference source 15 supplies a clock frequency pulse input to the one-shot multivibrator 14, which, in turn, resets the counter periodically or repetitively on the falling edge of the reference frequency source pulses.

For a more complete understanding of the interrelationship of the components, consider the desired multiplier function represented by the letter "$M$", an integer greater than unity, the reference frequency from the frequency reference source 15 represented by the symbol $F_R$ and the multiplied frequency at the output 16 represented by the symbol $F_M$, then $$F_M = MF_R \tag{1}$$

The relationship of the frequency of the oscillator 12 clock input to the counter 10 to the output 16 is such that the frequency $F_O$ of the oscillator 12, when divided by integer value N is equal to the frequency $F_O$, as $$F_O = NF_M \tag{2}$$

Stated another way with respect to equations (1) and (2), the frequency $F_O$ of the oscillator 12 is also equal to the multiplier function times the integer times the reference frequency, as $$F_O = NMF_R \tag{3}$$

The pulse width T of the output of the one-shot multivibrator 14 is predetermined and the multivibrator output signal triggers the reset of the counter 10. The output pulse width $T$ can be defined as:

$$T = \frac{1}{2\,MNF_R} = \frac{1}{2\,NF_M} \tag{4}$$

The key to output frequency $F_M$ to exactly "$M$" full cycles, the oscillator frequency must be maintained between the following functions:

$$\frac{NM - \frac{N}{4}}{\frac{1}{F_{R\,(max)}} - \frac{1}{2MNF_{R\,(max)}}} < F_O < \frac{NM + \frac{N}{4}}{\frac{1}{F_{R\,(min)}} + \frac{1}{2MNF_{R\,(min)}}} \tag{5}$$

For any given stability of the oscillator 12, equation (5) sets a minimum value for the divisor $M$.

Figure 2:
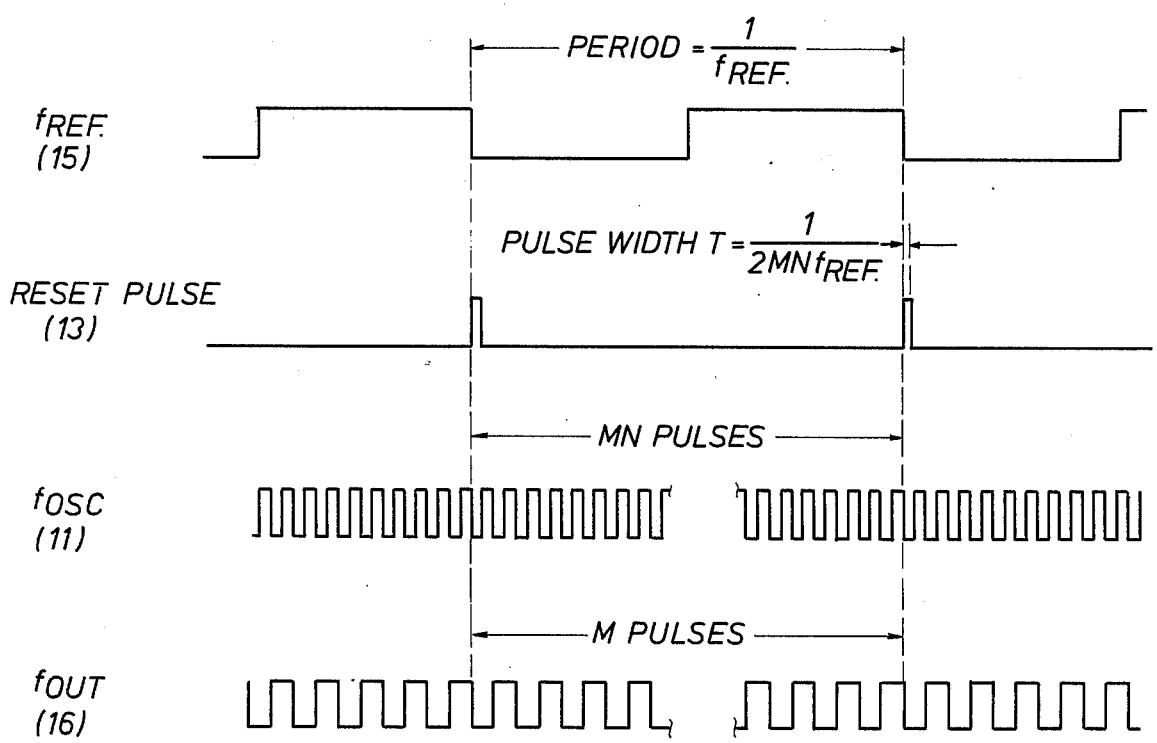
FIG. 2 is a wave form representation of the timing relationship of the system.

As shown in FIG. 2, the reference frequency $F_R$ periodically occurs and triggers the multivibrator 14. The pulse output of the multivibrator 14 has a time period $T$ during which the counter 10 is reset. The oscillator 12 supplies pulses to the counter 10 at a frequency equal to the product of the multiplier function $M$, the integer value $N$ and the reference frequency $F_R$. The counter 10 divides the oscillator frequency by the integer value $N$ to provide the multiplied output frequency $F_M$.

In a practical example of the foregoing system, the following relationship is exemplary:

Reference frequency $F_R = 1$Hz
Multiplier Function M = 400
Output frequency $F_M = 400$Hz
N = 256
T = 4.88 microseconds
$F_O = 102,400$ Hz ± 64 Hz.

This means that the frequency stability of the oscillator should be better than plus or minus 0.0625 percent.

It will be noted that it is convenient to make the integer N a power of eithr 2 or 10.

While particular embodiments of the present invention have been shown and described, it is apparent that changes and modifications may be made without departing from this invention in its broader aspects; and therefore, the aim in the appended claims is to cover all such changes and modifications as fall within the true spirit and scope of this invention.

What is claimed is:

1. An open-loop digital frequency multiplier for multiplying a low frequency of clock pulses by a desired multiple M to produce high frequency output pulses which are synchronized to low frequency reference pulses, said multiplier comprising:
 a source of clock pulses at a low reference frequency,
 a source of higher frequency clock input pulses,
 a multi-stage digital counter means which produces as its output said high frequency output pulses, reset means coupled to said source of reference frequency clock pulses and responsive thereto for providing to said digital counter means repetitive reset pulses having a pulse width of time duration $T$ for repetitively resetting said counter means as periodic occurrences corresponding to said reference frequency pulse occurrences,
 means coupling said higher frequency clock input pulses to the digital counter means, said digital counter means including means for dividing said higher input frequency of clock input pulses by an integer value $N$ whereby the output frequency of said output pulses produced by the digital counter means represents the product of said reference frequency and the multiplier function $M$ and equals the ratio of said higher frequency of clock input pulses and the integer $N$.

2. The apparatus as defined in claim 1 wherein the frequency of said input frequency clock pulses is between the limits determined by the following equation:

$$\frac{NM - \frac{N}{4}}{\frac{1}{F_{ref\,(max)}} - \frac{1}{2MNF_{ref\,(max)}}} < F_{osc} < \frac{NM + \frac{N}{4}}{\frac{1}{F_{ref\,(min)}} - \frac{1}{2MNF_{ref\,(min)}}}$$

where $N$ = the integer value
 $M$ = the frequency of said output pulses divided by the frequency of the reference input pulses
 $F_{ref}$ = the reference frequency
 $F_{osc}$ = the frequency of the input clock pulses 3. The apparatus as defined in claim 2 wherein the integer value is a power of the number 2 or 10.

4. The apparatus as defined in claim 3 wherein said timing period has a pulse width $T$ equal to $$\frac{1}{2MNF_{ref}}$$

and equal to $$\frac{1}{2NF_{out}}.$$

5. The apparatus as defined in claim 4 wherein said input pulses are at a frequency equal to $MNF_{ref}$ and equal to $NF$ out.

6. The multiplier as defined in claim 1 wherein said reset means comprises a one-shot multivibrator means whereby the reset pulses are generated at instances corresponding to the falling edges of said reference frequency source pulses and said counter means is reset during said time duration $T$.

* * * * *